United States Patent [19]
Kim et al.

[11] Patent Number: 5,535,356
[45] Date of Patent: Jul. 9, 1996

[54] DIGITAL DATA RECORDING/PLAYBACK SYSTEM UTILIZING EEPROM AND ROM MEMORIES AS A STORAGE MEDIUM

[75] Inventors: Suk-ki Kim; Hyeong-keon An, both of Pucheon-city; Tae-sik Joo; Suk-jung Lee, both of Seoul, all of Rep. of Korea

[73] Assignee: Samsung Electronics Co., Ltd., Suwon, Rep. of Korea

[21] Appl. No.: 942,059

[22] Filed: Sep. 9, 1992

[30] Foreign Application Priority Data

Sep. 9, 1991 [KR] Rep. of Korea .................. 91 15669
Feb. 14, 1992 [KR] Rep. of Korea .................. 92 2220

[51] Int. Cl.$^6$ ............................. G06F 12/00; H01J 3/00
[52] U.S. Cl. ..................... 395/430; 395/888; 395/889; 364/237.8; 364/260.6; 364/DIG. 1
[58] Field of Search ................. 364/200 MS File, 364/900 MS File; 341/126; 395/425, 429, 889, 430, 888, 431; 360/32, 51, 72.1

[56] References Cited

U.S. PATENT DOCUMENTS

| | | | |
|---|---|---|---|
| 4,413,289 | 11/1983 | Weaver et al. | 360/51 |
| 4,679,085 | 7/1987 | Johnson et al. | 348/716 |
| 4,689,022 | 8/1987 | Peers et al. | 434/307 R |
| 4,736,340 | 4/1988 | Desserrieres et al. | 395/155 |
| 4,769,767 | 9/1988 | Hilbrink | 395/375 |
| 4,771,671 | 9/1988 | Hoff, Jr. | 84/645 |
| 4,813,014 | 3/1989 | DeBell | 365/45 |
| 4,864,626 | 9/1989 | Yang | 381/61 |
| 4,866,756 | 9/1989 | Crane et al. | 379/88 |
| 5,068,783 | 11/1991 | Tanagawa et al. | 395/575 |
| 5,113,293 | 5/1992 | Endo et al. | 360/32 |
| 5,161,012 | 11/1992 | Choi | 348/564 |
| 5,206,938 | 4/1993 | Fujioka | 395/400 |
| 5,227,987 | 7/1993 | Imazawa et al. | 364/606 |
| 5,311,175 | 5/1994 | Waldman | 341/34 |
| 5,313,650 | 5/1994 | Mitsuishi et al. | 395/800 |

*Primary Examiner*—Matthew M. Kim
*Attorney, Agent, or Firm*—Cushman Darby & Cushman

[57] ABSTRACT

A digital data storage system which does not require the use of moving, mechanical components, and which utilizes semiconductor memory elements. In one embodiment, the digital data storage system includes a ROM, a system control microcomputer, a digital signal processor (DSP), and a D/A converter. In operation, the DSP is responsive to control signals generated by the system control microcomputer for reading out digital data, e.g., digital audio data, stored in the ROM, and decoding the read-out digital data. The D/A converter functions to convert the decoded read-out digital data into an analog output signal, e.g., an analog audio signal, and to supply the analog output signal to an output terminal. The digital data storage system of this embodiment is a playback-only system. In another embodiment, the digital data storage system includes all of the elements of the above-described embodiment, and further includes an A/D converter and an EEPROM, to facilitate the recording of digital data. In operation, during a record mode of operation, the A/D converter functions to convert an input analog signal, e.g., an analog audio signal, into an input digital data signal, and the DSP functions, in response to the control signals, to write the input digital data signal into the EEPROM. The digital data storage device of this embodiment functions as a record/playback system.

4 Claims, 5 Drawing Sheets

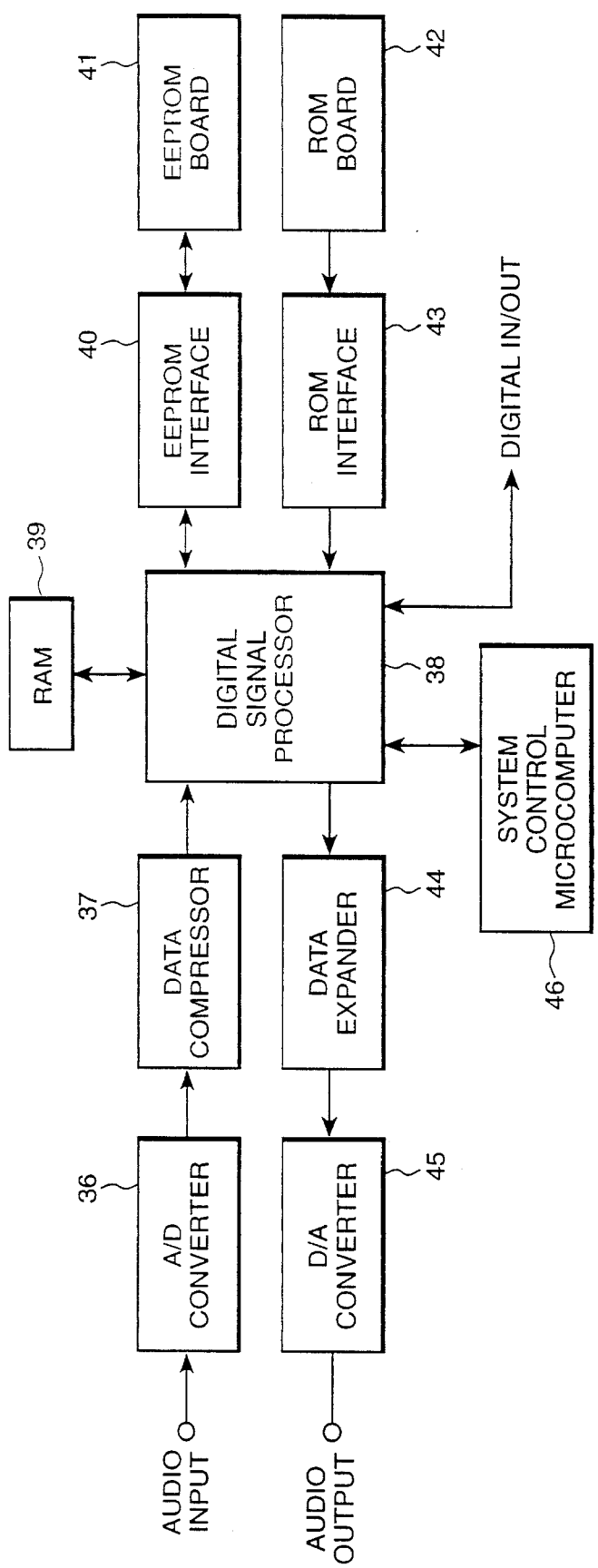

DIGITAL DATA RECORDING/PLAYBACK SYSTEM UTILIZING EEPROM AND ROM MEMORIES AS A STORAGE MEDIUM

FIELD OF THE INVENTION

The present invention relates generally to digital data storage systems, and more particularly, to a novel type of digital data storage system utilizing a semiconductor memory device.

BACKGROUND OF THE INVENTION

Conventional types of digital data storage systems include compact disc read only memory devices (CD players and CD-ROM devices) and digital audio tape recorder/playback devices (DAT devices).

FIG. 1 depicts a functional block diagram of a conventional DAT device. As can be seen in FIG. 1, the conventional DAT device includes a recording section comprised of an analog-to-digital (A/D) converter 1, a digital signal processor (DSP) 2, a digital memory 3, a recording amplifier 4, and a rotary head (labelled "HEAD"). In operation, an analog audio signal to be recorded is inputted to the A/D converter 1, which functions to convert the analog audio signal into a digital signal. The DSP 2 then compresses and encodes the digital signal in accordance with an EFM (eight-to-fourteen bit) encoding scheme, which incorporates a Cross-Interleaved Reed-Solomon Error Correction Code (CIRC), to thereby interleave the resultant pulse-coded modulation (PCM) digital data blocks in a non-sequential manner and provide an Error Correction Code (ECC) sub-block for each of the PCM digital data blocks. The thusly EFM-encoded digital data is then stored in digital memory 3, to facilitate time-base compression of the data. The EFM-encoded digital data is then read out of the digital memory on a first-in, first-out (FIFO) basis, and applied to the recording amplifier 4, which amplifies the EFM-encoded digital signal (which constitutes a representation of the original input analog audio signal). The thusly amplified EFM-encoded digital audio signal is then recorded on a digital audio tape (which is driven by the "CAPSTAN") by the rotary head ("HEAD"). The recording amplifier 4 is also responsive to an automatic track-finding (ATF) signal supplied thereto by an ATF signal generator 5, to thereby ensure that the ATF signal is recorded on an ATF region of the digital audio tape.

With continuing reference to FIG. 1, it can be seen that the conventional DAT device also includes a playback section comprised of a playback amplifier/waveform equalizer/signal detector 6, the DSP 2, the digital memory 3, a digital-to-analog (D/A) converter 7, a servo system 8, and a system controller 9. In operation, the rotary head functions to read the recorded EFM-encoded digital audio signal from the digital audio tape. The read-out digital audio signal is then amplified and equalized by the playback amplifier/waveform equalizer/signal detector 6. The output of the detector 6 is then fed to the DSP 2, which expands (de-compresses), demodulates, decodes, de-interleaves and performs error correction on the amplified and equalized digital audio signal. The D/A converter 7 then converts the decoded, error-corrected digital audio signal output by the DSP 2 into an analog audio signal, which is a close reproduction of the original analog audio signal represented by the recorded digital audio signal read from the digital audio tape. The detector 6 also functions to extract the ATF signal from the digital signal read from the digital audio tape. This ATF signal is then fed to the servo system 8, which uses this ATF signal as a tracking servo control signal to maintain the rotary head in accurate relationship to the proper information track on the digital audio tape. Further, the system controller 9 functions, in response to a control signal supplied thereto by an envelope detector 13, to control the rate of travel of the digital audio tape. The system controller 9 also processes sub-code data extracted from the read-out digital audio signal to facilitate user interface with a keypad 10 and display 11. The clock generator 12 generates the timing signals for synchronizing the operation of the various components of the overall system. The servo system 8 also includes a drum servo portion (not shown) and a capstan servo portion (not shown). The drum servo portion is comprised of a speed control circuit, a phase control circuit, and a bias control circuit, which cooperatively function to rotate the rotary head at a precisely accurate rotational speed and to precisely maintain a proper phase relationship between the read-out digital signal and a reference phase. The capstan servo portion is comprised of a speed control circuit, an ATF circuit, and a phase control circuit, which cooperatively function to more precisely control the rate of travel of the digital audio tape at a constant speed during both recording and playback operations.

The above-described conventional DAT device suffers from the following drawbacks and shortcomings. More particularly, although the data transfer rate (i.e., recording and playback speed) of a DAT device is faster than that of a CD-ROM device, it is still slow. Further, DAT devices utilize moving mechanical parts, such as a rotary head and tape drive, which are subject to degradation over time due to wear and tear and exposure to varying environmental conditions, thereby limiting the reliability and useful life thereof, and increasing the maintenance cost thereof. Moreover, because DAT devices use mechanical parts and an RF amplifier, among other things, the integrity of the data processed thereby is compromised. Additionally, the use of mechanical parts which must be precisely servo-controlled entails the use of complex electronic servo control componentry which imposes constraints on the cost, size, and complexity of the device. Furthermore, the data packing density (i.e., memory capacity) of the digital audio tape is limited by several factors, including separation and gap losses, the size of the magnetic particles whose orientation represents the recorded data, and the rotational frequency of the rotary head.

The conventional CD-ROM devices suffer from drawbacks and shortcomings similar to those described above in connection with DAT devices. Although the optical pickup head used in CD-ROM devices is not very susceptible to wear and tear, because it is only movable in fine increments for focus and tracking purposes, it is difficult to manufacture and servo control, thereby imposing constraints on the cost, size, complexity, and reliability of the device. Moreover, an optical carriage/sled is required to transport the optical pickup head radially across the surface of the compact disc (CD), and this sled, since it is a moving, mechanical component, is susceptible to malfunction and wear and tear, thereby imposing further constraints on the cost, size, complexity, and reliability of the device. Further, the CD is rotated by a motor-driven spindle/turntable mechanism, which not only imposes yet further constraints on the cost, size, complexity, and reliability of the CD-ROM device, but also imposes limitations on the playback speed of the device. Not only is the useful life of the CD-ROM device limited by virtue of the abovedescribed mechanical componentry, it is further limited by virtue of its use of a diode laser to generate the optical read beam which is used to detect the data recorded on the CD, since a diode laser has a finite life specified by the manufacturer thereof. Furthermore, the data packing density (i.e., memory capacity) of the CD is limited by several factors, including the wavelength of the laser beam generated by the diode laser, the response rate of the photodetectors used to detect the intensity of the modulated light reflected from the surface of the CD during playback, the linear speed of the optical carriage/sled, and the rotational velocity of the spindle/turntable mechanism. Yet further, CD-ROM devices are susceptible to interruption or complete shutdown during playback due to such factors as vibration, shock, and jerky movement of the device, e.g., such as is commonly experienced in CD players installed in automobiles or transportable CD players.

Based upon the above, there presently exists a need in the art for a digital data storage system which overcomes the above-described drawbacks and shortcomings of conventional digital data storage systems such as DAT and CD-ROM devices. The present invention fulfills this need.

SUMMARY OF THE INVENTION

In a first embodiment, the present invention encompasses a digital data storage system which includes a first semiconductor digital data storage device, e.g., an EEPROM, a second semiconductor digital data storage device, e.g., a RAM, a main computer, a system control microcomputer, and a digital signal processor. In a playback mode of operation, the digital signal processor is responsive to control signals generated by the system control microcomputer to read digital data, e.g., digital audio data, from the EEPROM, preferably via a memory interface unit, and to transmit the read-out digital data to the RAM. A RAM controller is provided for reading the data from the RAM to the main computer, preferably via a SCSI interface unit. In a record mode of operation, the digital signal processor is responsive to the control signals to transmit digital data, e.g., digital audio data, to be recorded from the RAM to the EEPROM, via the memory interface unit, for storage therein.

In a second embodiment, the present invention encompasses a digital data storage system which includes a first semiconductor digital data storage device, e.g., a ROM, a system control microcomputer, a digital signal processor, and a digital-to-analog (D/A) converter. In operation, the digital signal processor is responsive to control signals generated by the system control microcomputer for reading out digital data, e.g., digital audio data, stored in the ROM, preferably via a ROM interface, and decoding the read-out digital data. The D/A converter functions to convert the decoded read-out digital data into an analog output signal, e.g., an analog audio signal, and to supply the analog output signal to an output terminal. As can be appreciated, the digital data storage system of this embodiment is a playback-only system.

In a third embodiment, the present invention encompasses a digital data storage system which includes all of the elements of the second embodiment, and further includes an analog-to-digital (A/D) converter and a second semiconductor digital data storage device, e.g., an EEPROM, to facilitate the recording of digital data, in addition to the playback of digital data. In operation, during a record mode of operation, the A/D converter functions to convert an input analog signal, e.g., an input analog audio signal, into an input digital data signal, e.g., an input digital audio data signal, and the digital signal processor functions, in response to the control signals generated by the system control microcomputer, to write the input digital data into the EEPROM, preferably via an EEPROM interface. As can be appreciated, the digital data storage device of this embodiment functions as a record/playback system.

BRIEF DESCRIPTION OF THE DRAWINGS

These and various other features and advantages of the present invention will be readily understood with reference to the following detailed description taken in conjunction with the accompanying drawings, wherein like reference numerals designate like structural elements, and, in which:

FIG. 3 is a functional block diagram of a digital audio record/playback system constructed in accordance with a second embodiment of the present invention; and, FIG. 4 is a functional block diagram of a digital audio playback system constructed in accordance with a third embodiment of the present invention.

DETAILED DESCRIPTION OF THE INVENTION

Figure 1:
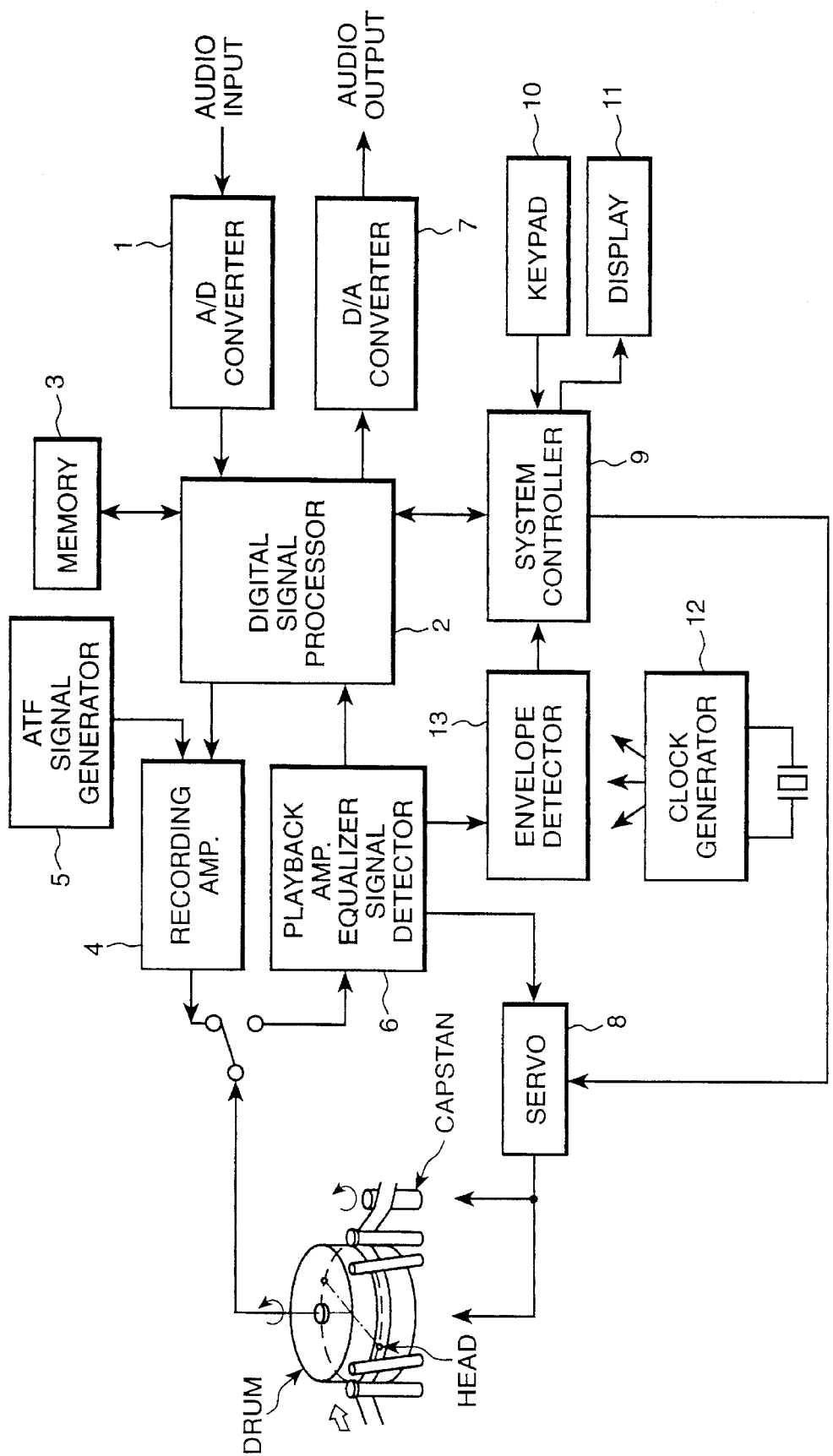
FIG. 1 is a functional block diagram of a conventional DAT device.
Figure 2A:
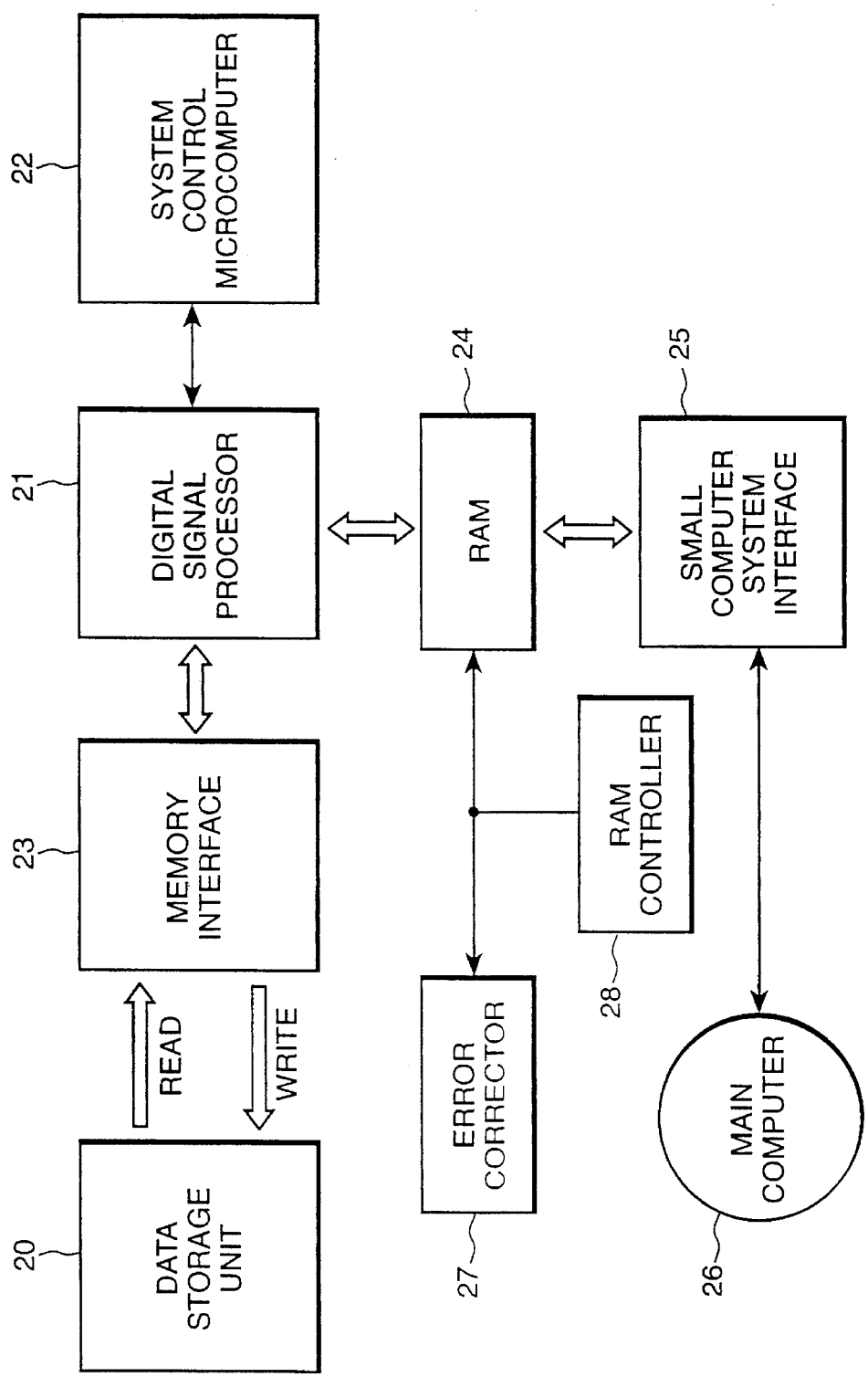
FIG. 2A is a functional block diagram of a digital data storage system constructed in accordance with a first embodiment of the present invention.

With reference now to FIG. 2A, there can be seen a digital data storage system constructed in accordance with a first embodiment of the present invention. The digital data storage system includes a data storage unit 20 comprised of a semiconductor memory device. The type of semiconductor memory device utilized is not limiting to the present invention. Illustratively, the semiconductor memory device may be a read-only-memory (ROM) or an electrically erasable read-only-memory (EEPROM). Of course, if a ROM is utilized, only readout of data stored in the ROM is possible, whereas, if a EEPROM is utilized, data may be written into and read out of the memory device. In the following description, it is assumed that a EEPROM is utilized.

The digital data storage system also includes a digital signal processor (DSP) 21 which facilitates the recording and playback of data into and out of the data storage unit 20, in a manner described more fully hereinafter. A memory interface 23 is interposed between the data storage unit 20 and the digital signal processor 21. The memory interface functions in a well-known manner to buffer data being written into or read out of the data storage unit 20 from or to the digital signal processor 21. A random access memory device (RAM) 23 is provided for receiving data from a main computer 26 via a small computer system interface (SCSI) 25 for inputting to the digital signal processor 21, and, for receiving data from the digital signal processor 21 for outputting to the main computer 26 via the SCSI 25. A RAM controller 28 is provided for controlling the input/output operations of the RAM 24. The RAM controller 28 also functions, in cooperation with an error corrector 27, to at least partially decode (e.g., third-order error correction) the error correction code embedded in the data read out of the DSP 21 into the RAM 24, and to encode the data being written into the RAM 24 from the main computer 26 with the error correction code, which can be, for example, a cross-interleaved Reed-Solomon error correction code (CIRC), or any other suitable error correction code (ECC).

Figure 2B:
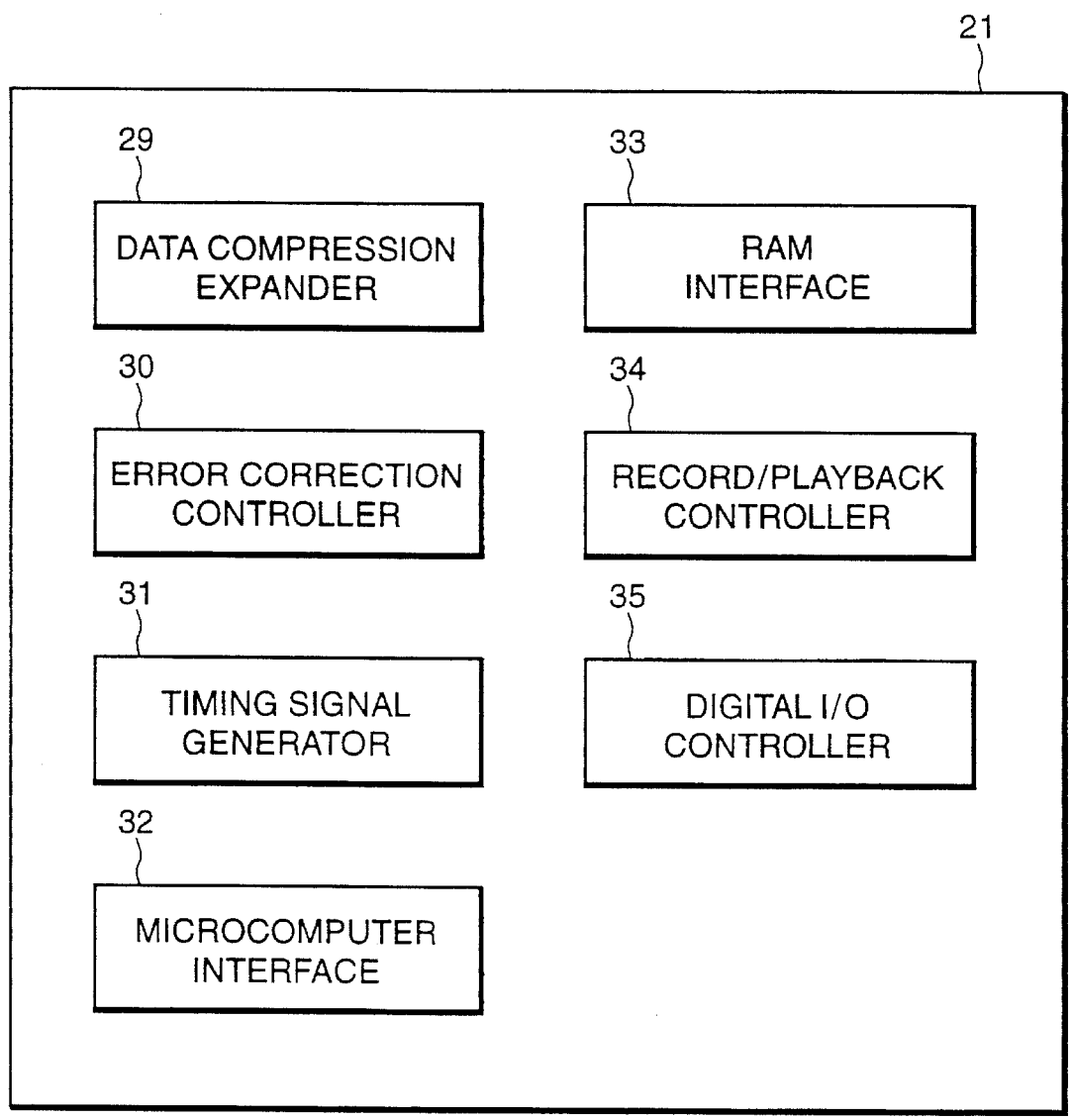
FIG. 2B is a detailed block diagram of the digital signal processor of the digital data storage system depicted in FIG. 2A.

With reference now to FIG. 2B, there can be seen a detailed block diagram of a preferred embodiment of the DSP 21. The DSP 21 therein shown includes a data compressor/expander (i.e., compander) 29 which functions to compress data received from the RAM 24 during recording, and to expand data received from the data storage unit 20 during playback. However, it should be clearly understood that this feature is optional. For example, if it is not necessary to compress the data from the main computer 26, and to expand the data from the data storage unit 20, the compander 29 may be eliminated. Alternatively, if it is desired to compress/expand some data and not compress/expand other data, the compander 29 can be disabled during the times that data which is not desired to be compressed/expanded is being processed.

The DSP 21 also includes an error correction controller 30 which is suitably configured, in a well-known manner, to perform such operations as syndrome calculation, error calculation, Reed-Solomon error correction coding and decoding, and for performing first-order and second-order error corrections on the input/output data processed by the DSP 21. The specific implementation of the error correction controller 30 will depend upon the type of data being processed by the DSP 21, and the particular coding/decoding scheme employed. Accordingly, it should be clearly understood that the particular type of error correction controller 30 utilized is not limiting to the present invention.

The DSP 21 further includes a microcomputer interface 32 which is connected to a system control microcomputer 22 (shown in FIG. 2A). The microcomputer interface 32 is adapted to receive mode data from the system control microcomputer 22. The mode data instructs the DSP 21 to perform a record or playback operation, depending upon the content thereof. The microcomputer interface 32 also serves to control the input/output of other system control information (e.g., sub-code data) between the system control microcomputer 22 and the DSP 21, in a manner which will be readily apparent to those skilled in the art.

The DSP 21 also includes a Ram interface 33 which functions, during a playback mode of operation, to supply data read out of the data storage unit 20 to the RAM 24, and, during a record mode of operation, to temporarily store data to be written into the data storage unit 20 in the memory interface 23. The RAM interface 33 also functions, during a playback mode of operation, to generate the RAM address for decoding the error correction code, and, during a record mode of operation, to generate the Ram address for encoding the error correction code.

The DSP 21 further includes a record/playback controller 34 which functions to generate the internal timing signals for synchronizing the processing of the various portions of the data being read out of or written into the data storage unit 20, e.g., the digital data received from the data storage unit 20 or the main computer 26, and the sub-code data received from the system control microcomputer 22. A timing signal generator 31 is also provided for generating the various timing signals required to synchronize the operation of the data compander 29, the error correction controller 30, the microcomputer interface 32, the RAM interface 33, and a digital I/O controller 35. The digital I/O controller 35 functions, during a playback mode of operation, to externally output data read out of the data storage unit 20, during a record mode of operation, to receive digital data, e.g., digital audio data, from another external data source, and to supply such data to the digital storage unit 20 for recording. The digital I/O controller 35 preferably incorporates a serial copy management system (SCMS) which functions to perform biphase modulation of input data to be recorded in the data storage unit 20, and biphase demodulation of output data read out of the data storage unit 20, and further, to detect a sync signal included in the output data and to generate a sync signal for inclusion in the input data. This sync signal is then injected into an external or internal digital phase locked loop (not shown) which, in turn, functions in a well-known manner to synchronize the input/output control function of the digital I/O controller.

With reference now to FIG. 3, there can be seen a functional block diagram of a digital audio record/playback (DARP) system constructed in accordance with a second embodiment of the present invention. The DARP system includes a recording section comprised of an analog-to-digital (A/D) converter 36, a data compressor 37, a DSP 38, a RAM 39, an EEPROM interface, and an EEPROM board 41. The A/D converter 36 converts an input analog audio signal from an AUDIO INPUT terminal into a digital audio signal. The data compressor 37 compresses the digital audio signal in a well-known manner, to thereby decrease the required memory capacity for storing the digital audio signal. The DSP 38 includes a RAM controller (not shown), a memory management circuit (not shown), an error correction controller (not shown), an A-D/D-A controller (not shown), an interpolator (not shown), and a microcomputer interface (not shown). The specific implementation of the DSP 38 and its constituent elements is not limiting to the invention, and can suitably be similar to that of the DSP 21 of the digital data storage system of the first embodiment of the present invention. In this connection, the details of the implementation of the DSP 38 are well within the realm of those skilled in the pertinent art. The EEPROM interface 40 functions in a well-known manner to buffer input digital audio data received from the DSP 38 at a relatively high speed, so that it can be recorded in an EEPROM (not shown) on the EEPROM board 41 at a relatively slower speed. The EEPROM board 41 includes an IC card having one or more EEPROMs for storing the input digital audio data.

The DARP system shown in FIG. 3 also includes a playback section comprised of a ROM board 42, a ROM interface 43, the DSP 38, a data expander 44, and a digital-to-analog (D/A) converter 45. The ROM board 42 includes an IC card having one or more ROMs which store pre-recorded digital audio data for playback. The ROM interface 43 functions in the normal manner to provide a buffer function for digital audio data read out of the ROM board 42 and supplied to the DSP 38. The data expander 44 functions in a well-known manner to expand the compressed digital audio signal supplied by the DSP 38 into its original state. The D/A converter 45 functions to convert the expanded digital audio signal into an analog audio signal which is a close reproduction of the original input analog audio signal, and further, to output the reproduced analog audio signal via the AUDIO OUTPUT terminal.

The DARP system also includes a system control microcomputer 46 which functions, during a playback mode of operation, to decode sub-code data extracted from the digital audio data supplied by the DSP 38. During a record mode of operation, system control microcomputer 46 functions to supply subcode data and mode data to the DSP 38. System control microcomputer 46 also controls the overall operation of the DARP, in a manner discussed hereinbefore in conjunction with the digital data storage system of the first embodiment of the present invention.

Figure 4:
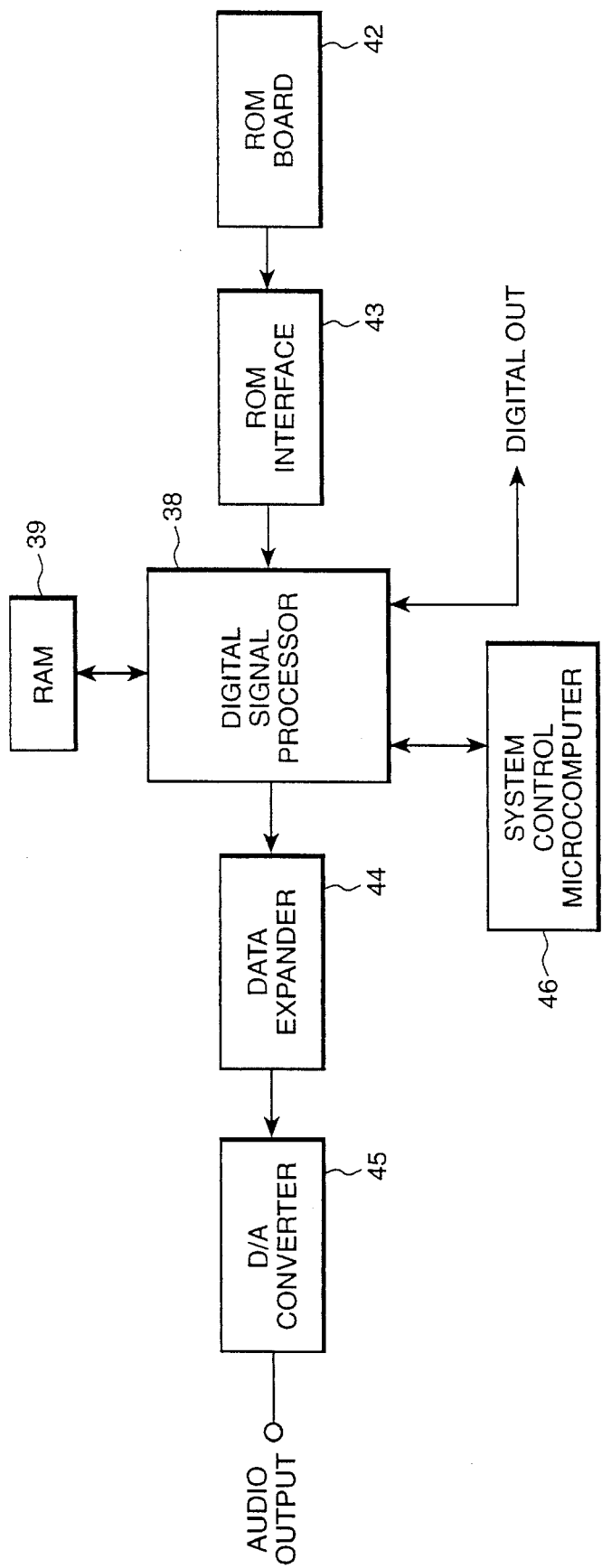

With reference now to FIG. 4, there can be seen a playback-only digital audio system constructed in accordance with a third embodiment of the present invention. This embodiment of the present invention is the same as the above-described second embodiment of the present invention, except that the recording section of the second embodiment is eliminated since this section is not required for a playback-only system.

Based upon the foregoing, it should be appreciated that a digital data storage system constructed in accordance with any of the abovedescribed embodiments of the present invention overcomes the drawbacks and shortcomings of the conventional digital data storage systems such as CDROM devices and DAT devices, as well as providing other significant advantages thereover.

More particularly, the digital data storage system of the present invention does not require the use of any moving, mechanical or electromechanical components, thereby significantly increasing the reliability and useful life thereof. Further, because the digital data storage system does not require the utilization of complex and bulky mechanical componentry and servo control mechanisms therefor, it can be made much smaller, lighter, and at a lower cost than conventional digital data storage systems. Also, the digital data storage system of the present invention is more rugged and durable than conventional digital data storage systems, since it is not susceptible to interruption or complete shutdown during operation due to such factors as vibration, shock, and jerky movement thereof, thereby making it more suitable for use as a transportable data storage device than conventional digital data storage systems.

Moreover, the data packing density (i.e., memory capacity) of the digital data storage system of the present invention is only limited by the memory capacity of the semiconductor memory devices employed therein. In this connection, it has been projected that semiconductor memory devices (e.g., so-called "flash" memory devices and future-generation DRAMs) having a 1-Giga byte capacity will ultimately be realized. Of course, as higher-density (e.g., ULSI) memory devices become available, the price per bit of data storage achievable with the digital data storage system of the present invention will be lowered, thereby ultimately providing a significant cost savings over conventional digital data storage systems. Yet further, the data transfer rates achievable with the digital data storage system of the present invention are far superior to those achievable with conventional digital data storage systems, thereby enhancing the utility and versatility of such systems.

Additionally, with the digital data storage system of the present invention, the conventional recording media, i.e. magnetic tapes and optical discs, used in conventional digital data storage systems such as CD-ROM drives, CD players, DAT devices, DCC (digital compact cassette) devices, and videodisc players (LDPs), have been replaced with semiconductor memory devices which have a higher memory capacity, are less expensive to manufacture, are more compact, are inherently more reliable, and are less prone to damage and degradation. Finally, since the digital data storage system of the present invention directly retrieves digital data from a digital data memory device, no intermediate step of detecting and amplifying an RF signal is required, as is required with conventional digital data storage systems, thereby eliminating this source of signal noise and distortion, and thus enhancing the integrity and quality of the data processed thereby.

Although the present invention has been described in conjunction with various alternative embodiments thereof, it should be clearly understood that many variations and/or modifications of the basic inventive concepts herein taught which may appear to those skilled in the pertinent art will still fall within the spirit and scope of the present invention, as defined in the appended claims.

What is claimed is:

1. A digital data storage system, comprising:
   a first semiconductor digital data storage device comprised of at least one ROM;
   a second semiconductor digital data storage device comprised of at least one EEPROM;
   a first memory interface unit connected to said first semiconductor digital data storage device;
   a digital signal processor connected to said first memory interface unit;
   a RAM connected to said digital signal processor, wherein said RAM serves as a temporary data storage device for said digital signal processor;
   a second memory interface unit coupled between said second semiconductor digital data storage device and said digital signal processor;
   a system control microcomputer for generating control signals;
   an analog-to-digital converter for converting an analog input signal into an input digital data signal;
   a data compressor interposed between said analog-to-digital converter and said digital signal processor, for compressing said input digital data signal;
   wherein said digital signal processor is responsive to said control signals for reading out read-out digital data stored in said first semiconductor digital data storage device, via said first memory interface, and further, for decoding said read-out digital data, to thereby produce decoded read-out digital data;
   a digital-to-analog converter for converting said decoded read-out digital data into an analog output signal;
   wherein said digital signal processor is further responsive to said control signals for writing said input digital data signal into said second semiconductor digital data storage device, via said second memory interface unit;
   wherein said digital signal processor includes a digital I/O controller for detecting sync signals included in said read-out digital data and for generating sync signals for inclusion in said input digital data signal; and
   a digital phase-locked loop responsive to said sync signals for synchronizing the reading and writing operations of said digital signal processor.

2. The digital data storage system as set forth in claim 1, wherein said digital data comprises digital audio data, and said analog output signal comprises an analog audio output signal.

3. The digital data storage system as set forth in claim 1, further comprising a data expander interposed between said digital signal processor and said digital-to-analog converter, for expanding said decoded read-out digital data.

4. The digital data storage system as set forth in claim 1, wherein said digital data comprises a digital audio signal, and said analog output signal comprises an analog audio output signal.

* * * * *